(12) United States Patent
Gray et al.

(10) Patent No.: US 9,664,729 B2
(45) Date of Patent: May 30, 2017

(54) APPARATUS AND METHOD FOR MONITORING OPERATION OF AN INSULATED GATE BIPOLAR TRANSISTOR

(71) Applicants: Randall C. Gray, Tempe, AZ (US); Ibrahim S. Kandah, Canton, MI (US); Philipe J. Perruchoud, Tournefeuille (FR); John M. Pigott, Phoenix, AZ (US); Thierry Sicard, Auzeville Tolosan (FR)

(72) Inventors: Randall C. Gray, Tempe, AZ (US); Ibrahim S. Kandah, Canton, MI (US); Philipe J. Perruchoud, Tournefeuille (FR); John M. Pigott, Phoenix, AZ (US); Thierry Sicard, Auzeville Tolosan (FR)

(73) Assignee: NXP USA, Inc., Austin, TX (US)

( * ) Notice: Subject to any disclaimer, the term of this patent is extended or adjusted under 35 U.S.C. 154(b) by 0 days.

(21) Appl. No.: 13/882,710

(22) PCT Filed: Jan. 9, 2013

(86) PCT No.: PCT/IB2013/000140
§ 371 (c)(1),
(2) Date: Apr. 30, 2013

(65) Prior Publication Data
US 2015/0316602 A1 Nov. 5, 2015

(51) Int. Cl.
*G01R 31/02* (2006.01)
*G01R 31/26* (2014.01)
*G01R 31/327* (2006.01)
*H01H 9/00* (2006.01)

(52) U.S. Cl.
CPC ....... *G01R 31/2608* (2013.01); *G01R 31/261* (2013.01); *G01R 31/3274* (2013.01); *H01H 9/00* (2013.01)

(58) Field of Classification Search
CPC .............................. H01L 22/20; H03K 19/0027
USPC .................... 324/762.08, 500, 537, 762.01
See application file for complete search history.

(56) References Cited

U.S. PATENT DOCUMENTS

| | | | | |
|---|---|---|---|---|
| 3,134,970 A | * | 5/1964 | Kelly | G08B 13/16 327/569 |
| 3,551,845 A | * | 12/1970 | Zelina | H02M 7/53835 331/113 A |
| 4,710,793 A | * | 12/1987 | Gray | H03K 3/2897 257/568 |
| 5,194,760 A | | 3/1993 | Braun et al. | |
| 5,225,972 A | * | 7/1993 | Sakamoto | H02M 3/338 331/112 |
| 5,903,181 A | * | 5/1999 | Mori | H03K 17/567 327/108 |
| 5,946,178 A | * | 8/1999 | Bijlenga | H02M 7/538 361/91.5 |
| 6,016,259 A | * | 1/2000 | Tamura | H02M 3/338 363/131 |

(Continued)

Primary Examiner — Giovanni Astacio-Oquendo

(57) ABSTRACT

Operation of an insulated gate bipolar transistor (IGBT) is monitored by an apparatus that has a capacitor connected between a collector of the IGBT and an input node. A processing circuit, coupled to the input node, responds to current flowing through the capacitor by providing an indication whether a voltage level at the collector is changing and the rate of that change. The processing circuit also employs the capacitor current to provide an output voltage that indicates the voltage at the IGBT collector.

20 Claims, 3 Drawing Sheets

(56) References Cited

U.S. PATENT DOCUMENTS

| | | | | |
|---|---|---|---|---|
| 6,194,884 B1* | 2/2001 | Kesler | ............... | G05F 3/222 |
| | | | | 323/285 |
| 6,459,324 B1* | 10/2002 | Neacsu | ............... | H03K 17/166 |
| | | | | 327/379 |
| 6,680,835 B2* | 1/2004 | Tabata | ............... | H03K 17/0828 |
| | | | | 361/79 |
| 7,167,064 B2* | 1/2007 | Miyaguchi | ............... | H01P 1/185 |
| | | | | 333/138 |
| 7,463,079 B2* | 12/2008 | De | ............... | H03K 17/08128 |
| | | | | 327/309 |
| 7,483,250 B2* | 1/2009 | Ishikawa | ............... | H03K 17/0828 |
| | | | | 361/101 |
| 7,852,172 B2* | 12/2010 | Arell | ............... | H03K 17/165 |
| | | | | 333/101 |
| 8,111,091 B2* | 2/2012 | Glass | ............... | G11C 27/026 |
| | | | | 327/96 |
| 9,316,681 B2* | 4/2016 | Sicard | ............... | G01R 31/2608 |
| 2008/0150370 A1* | 6/2008 | Heuermann | ............... | G04F 1/005 |
| | | | | 307/110 |
| 2012/0230076 A1* | 9/2012 | Palmer | ............... | H03K 17/0828 |
| | | | | 363/132 |
| 2016/0025800 A1* | 1/2016 | Sicard | ............... | G01R 31/2608 |
| | | | | 324/762.08 |

* cited by examiner

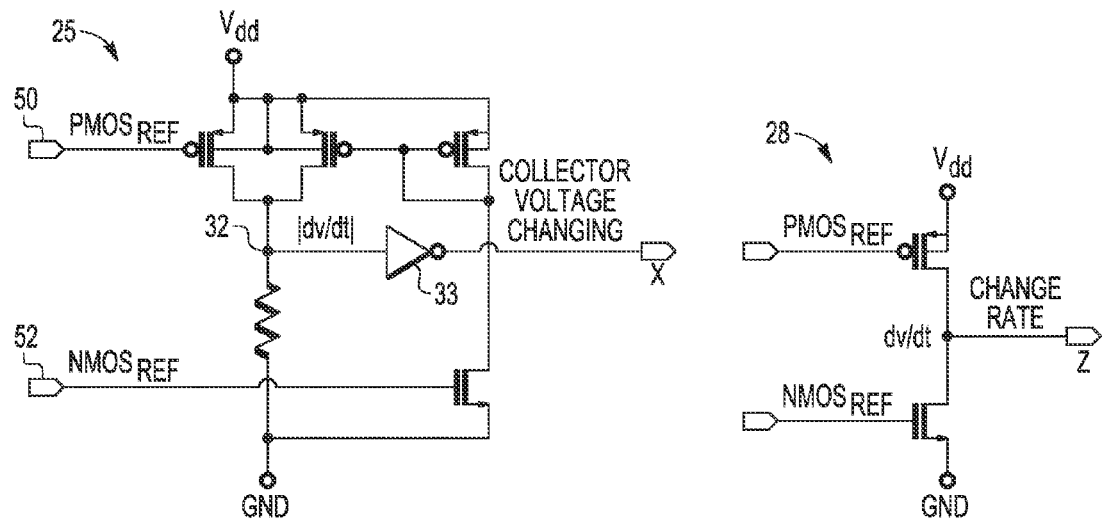
FIG. 4
FIG. 6
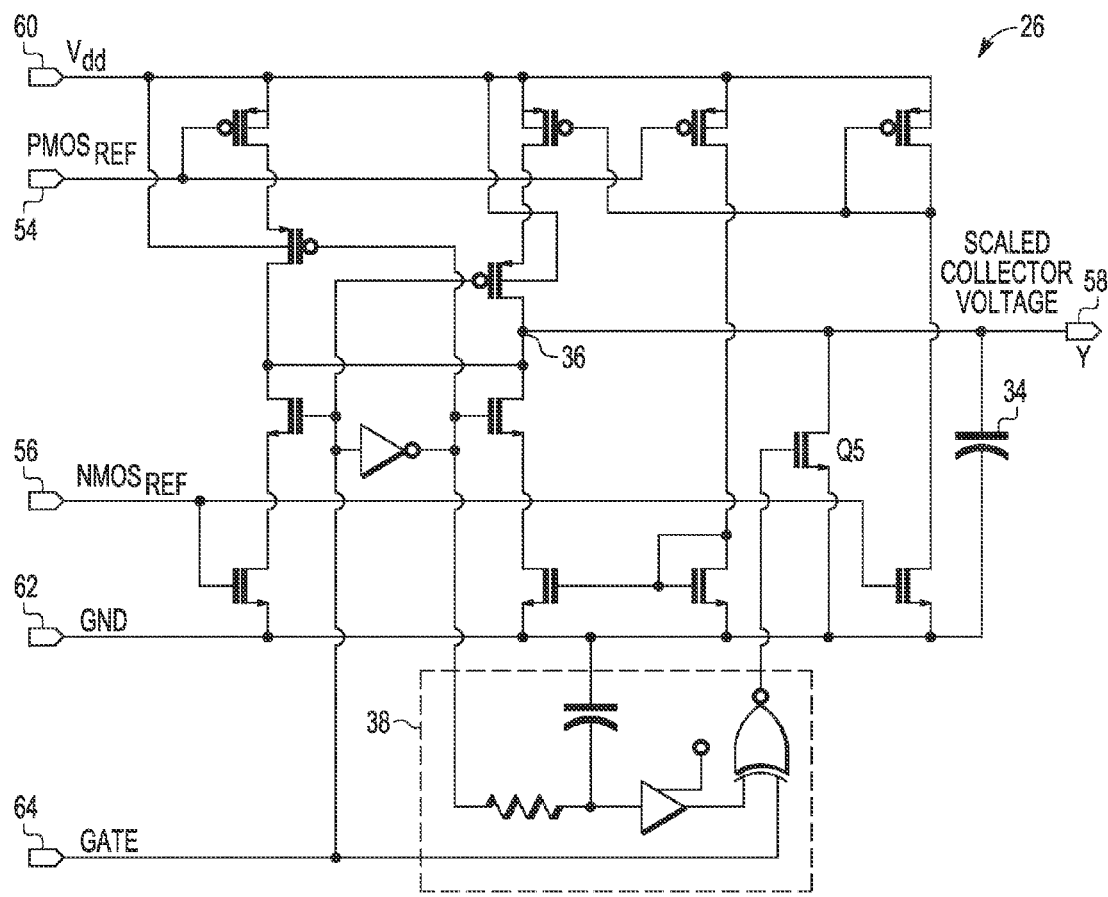
FIG. 5

APPARATUS AND METHOD FOR MONITORING OPERATION OF AN INSULATED GATE BIPOLAR TRANSISTOR

FIELD OF THE INVENTION

This disclosure relates to insulated gate bipolar transistor circuits, and more particularly to an apparatus and method for monitoring the operation of such transistors.

BACKGROUND OF THE INVENTION

An insulated gate bipolar transistor (IGBT) can be used as a switch in an apparatus, such as a motor drive or an inverter. The IGBT has three electrodes or terminals referred to as a gate, an emitter, and a collector that is sometimes called a drain. The potential applied to the gate controls the turn-on and turn-off operations of the transistor. As switches, IGBTs offer relatively high efficiency and fast switching capabilities compared to other switching devices.

An IGBT is often used to switch loads driven from several hundred to a few thousand volts. In such an installation, a failure may occur if the load is shorted when the transistor is fully turned on and carrying a large current. The IGBT then is subjected to an excessive power dissipation condition due to the high current flow through the device and the rapidly rising voltage across the IGBT's emitter and collector. If the short circuit condition exists for a sufficient period of time, the device can fail due to the excessive power dissipation. It can be beneficial, therefore, to turn off the IGBT under such a short circuit load condition. Because of the presence of parasitic inductance in the collector and emitter circuits of the IGBT, the maximum rate of turn off of the collector current may be restricted so as to not exceed the maximum collector-emitter rating of the device.

As a result, it is common practice to monitor the voltage between the collector and emitter of the IGBT device and provide a feedback signal indicating whether the differential voltage is large or small. The feedback signal is supplied to circuitry, such as a controller, that controls the bias of the gate and thus controls the operation of the transistor.

Previous circuits for monitoring IGBT devices simply connected a diode to the collector, wherein the diode was reverse biased when the collector was at a high voltage level. When the IGBT fully turned on and the collector was essentially at zero volts with respect to the emitter, the diode became conductive, thereby providing a signal to the gate control circuit. Thereafter, when the IGBT again turned off and the collector voltage increased, causing the diode to become non-conductive, the signal to the gate control circuit is altered. This is a rather rudimentary technique that simply provides a binary signal to the gate control circuitry indicating the on/off state of the transistor.

Prior devices avoided potential damage by switching the IGBT slowly, however, such an approach affects the rate at which the load current was controlled, which could result in energy losses. To minimize overall power dissipation, it is desirable to be able to switch the IGBT as fast as possible, without exceeding the maximum collector-emitter voltage rating of the IGBT. Achieving this operation requires more comprehensive information regarding the IGBT operation than can be provided by an implementation that uses only a sensing diode to monitor the IGBT device operation.

Because the collector voltage generally has values much higher than can be directly applied to circuits built with standard integrated circuit technologies, it is desirable to accurately scale this voltage to a level compatible with those of an integrated circuit connected to the device. Because it is desirable to avoid DC leakage paths, existing techniques such as using a resistor divider are not suitable to achieve a compatible voltage level.

Therefore, a monitor is desired that provides more detailed information about the status of the IGBT and in particular the collector voltage.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

FIG. 4 is a schematic diagram of an embodiment of a circuit for a voltage change detector in the collector monitor;

FIG. 5 is a schematic component diagram of an embodiment of a collector voltage indicator that may be incorporated in the collector monitor; and FIG. 6 is a schematic diagram of an embodiment of a collector voltage change rate indicator that may be used in the collector monitor.

DETAILED DESCRIPTION

Figure 1:
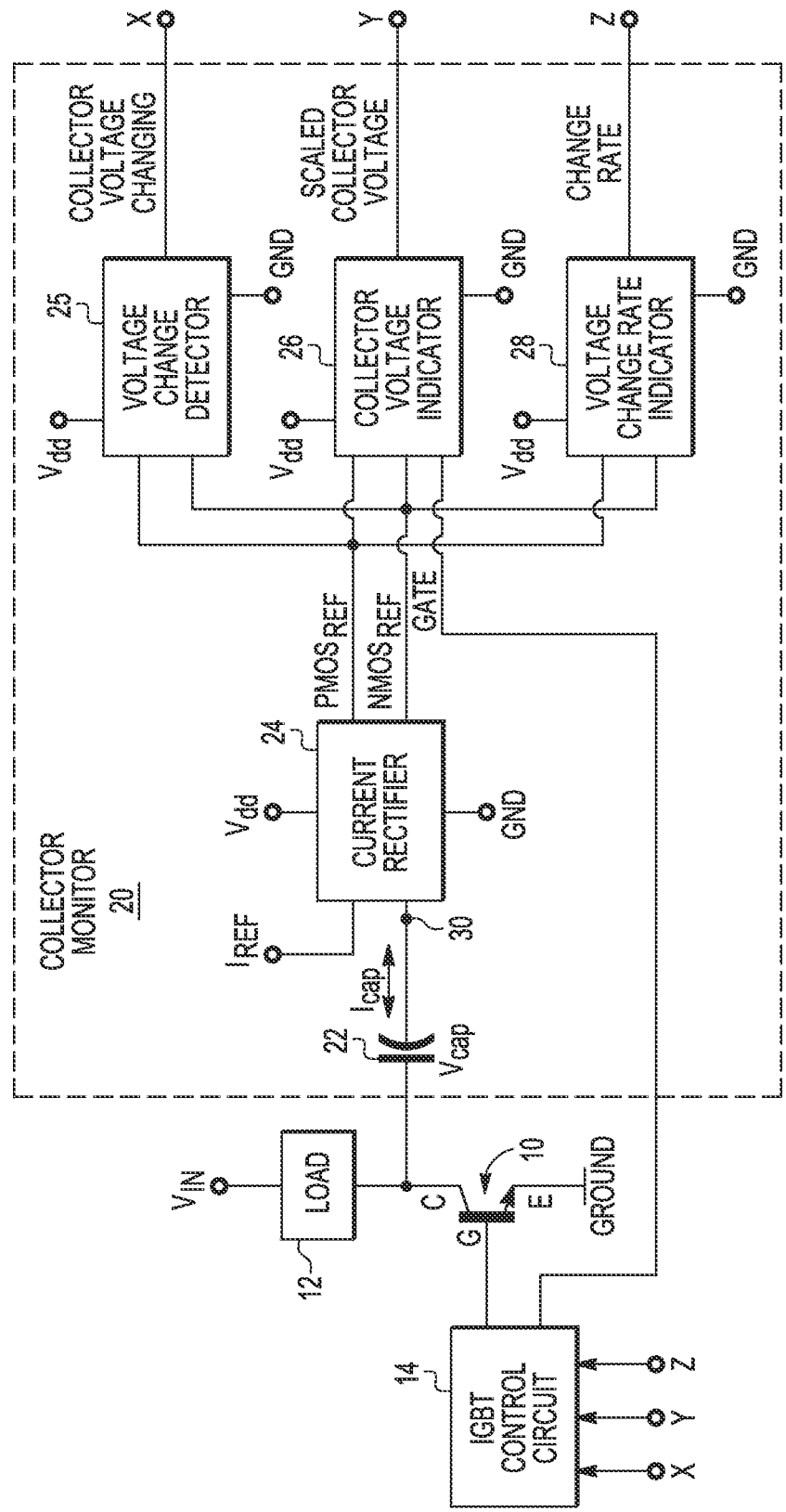
FIG. 1 is a block schematic diagram of an embodiment of a collector monitor that is connected to an IGBT circuit.

The present disclosure provides an apparatus for monitoring operation of a transistor, such as an insulated gate bipolar transistor (IGBT). The IGBT has an emitter, a collector and a gate, wherein a voltage potential applied to the gate controls a conduction path between the emitter and the collector. The monitoring apparatus includes a capacitor connected between the collector and an input node to which a processing circuit is coupled. The processing circuit responds to current flowing through the capacitor by providing a first indication of whether a voltage level at the collector is changing.

In one particular embodiment, the processing circuit further responds to current flowing through the capacitor by producing an output signal that indicates the voltage level at the collector of the IGBT.

In another embodiment, the processing circuit further responds to current flowing through the capacitor by producing a second indication of a rate at which the voltage level at the collector is changing.

The present disclosure also describes a method for monitoring operation of a transistor, which involves providing a capacitor connected between the collector and a monitor circuit. The method senses the magnitude of current flowing through the capacitor and in response thereto, produces a first indication of whether a voltage level at the collector is changing.

Another aspect of the monitoring method involves responding to current flowing through the capacitor by producing an output voltage that is a scaled down to denote the voltage level at the collector.

A further aspect of the monitoring method involves responding to current flowing through the capacitor by producing a second indication of a rate at which the voltage level at the collector is changing.

The following detailed description is merely illustrative in nature and is not intended to limit the present disclosure, or the application and uses of the present disclosure. Furthermore, there is no intention to be bound by any expressed or implied theory presented in the preceding technical field, background, or the following detailed description. The present disclosure provides various examples, embodiments and the like, which may be described herein in terms of functional or logical block elements. It should be recognized that such block elements may be realized by any number of hardware elements configured to perform the specified function. For example, one embodiment of the present disclosure may employ various integrated circuit elements such as memory elements, clock elements, logic elements, analog elements, or the like, which may carry out a variety of functions under the control of a microprocessor or another processing device. Further, it should be understood that all elements described herein may be implemented including in silicon or another semiconductor material, another implementation alternative, or any combination thereof.

The following description refers to a number of block elements or nodes or features being "connected" or "coupled" together. As used herein, unless expressly stated otherwise, "connected" means that one element/node/feature is joined to (or communicates with) another element/node/feature, and not necessarily mechanically. Unless expressly stated otherwise, "coupled" means that one element is directly or indirectly joined to (or directly or indirectly communicates with) another element, and not necessarily mechanically. Thus, although the schematics shown in the figures depict exemplary arrangements of elements, additional intervening elements, devices, features, or components may be present in an embodiment of the depicted subject matter. In addition, certain terminology may also be used in the following description for the purpose of reference only, and thus are not intended to be limiting. For example, terms such as "first", "second" and other such numerical terms referring to structures do not imply a sequence or order unless clearly indicated by the context.

Much of the inventive functionality and many of the inventive principles are best implemented with or in integrated circuits (ICs) including possibly application specific ICs or ICs with integrated processing or control or other structures. It is expected that one of ordinary skill, notwithstanding possibly significant effort and many design choices motivated by, for example, available time, current technology, and economic considerations, when guided by the concepts and principles disclosed herein will be readily capable of generating such ICs and structures with minimal experimentation. Therefore, in the interest of brevity and minimization of any risk of obscuring the principles and concepts according to below-described embodiments of the present invention, further discussion of such structures and ICs, if any, will be limited to the essentials with respect to the principles and concepts of the various embodiments.

With initial reference to FIG. 1, an insulated gate bipolar transistor (IGBT) 10 has its emitter (E) connected to ground and its collector (C) connected through a load 12 to a source of voltage $V_{IN}$. The gate (G) of the IGBT 10 is employed to bias the transistor into conductive and non-conductive states by a conventional signal produced by an IGBT control circuit 14. The operation of IGBT control circuit 14 can be controlled by a number of inputs designated inputs X, Y, and Z, as shown in FIG. 1, and as described further, below. Although the present embodiment is described in the context of an insulated gate bipolar transistor, it may be used with other types of transistors.

Figure 2:
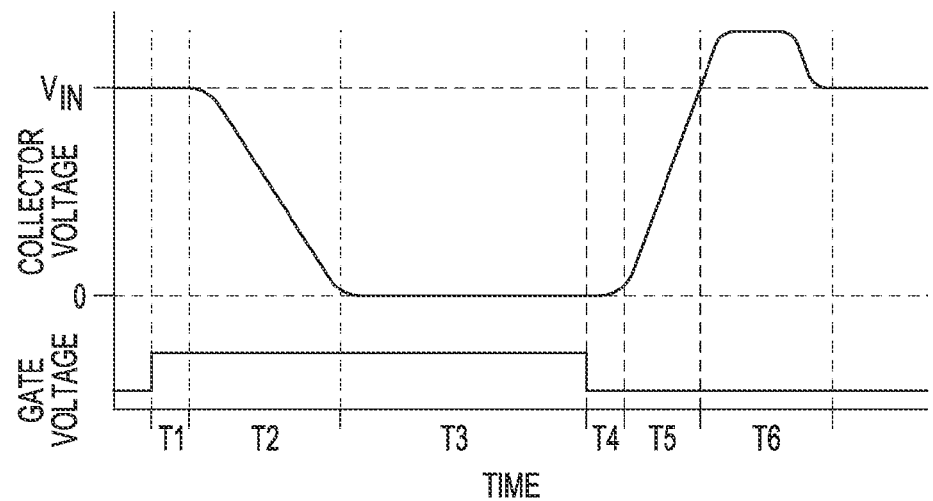
FIG. 2 is a waveform diagram of voltages at the collector and the gate of the IGBT in FIG. 1.

FIG. 2 depicts the voltage at the IGBT collector during an operating cycle of the IGBT 10. In the graph depicted in FIG. 2, the x-axis represents time, while the y-axis represents two figures. The lower portion of the y-axis indicates a gate voltage value, which may have either a high or low value. The low gate voltage is configured to turn off IGBT 10, while the high gate voltage is configured to turn on IGBT 10. A second portion of the y-axis represents the collector voltage of IGBT 10 at a given time. Initially the transistor is in the non-conductive state, wherein the collector of IGBT 10 is at the load supply voltage level $V_{IN}$. At time T1 the bias voltage applied to the IGBT 10's gate goes high. At this time, the IGBT 10 begins to conduct current and the collector voltage begins to decrease throughout time period designated T2. Eventually, the IGBT 10 enters fully conductive state at the commencement of a subsequent time period T3, during which the voltage level at the collector is essentially zero volts.

When the IGBT control circuit 14 transitions to turn off the IGBT 10 at the end of time period T3, a low voltage level is applied to the gate (indicated by the gate voltage value in FIG. 2 transitioning to a low voltage value). After a relatively short time period T4, with the gate voltage low, the IGBT 10 begins to turn off causing the collector voltage to increase during time period T5. At the end of time period T5, the IGBT again is in a non-conductive state. Note that after time period T5, the collector voltage level continues to increase above the load supply voltage level $V_{IN}$. This often occurs when the load/system 12 controlled by the IGBT 10 has a significant inductance that produces a voltage overshoot. That voltage overshoot can remain for a period of time (e.g., time period T6) until the energy in that inductive load is dissipated.

Referring back to FIG. 1, operation of the IGBT 10 is examined and monitored by a collector monitor 20 that responds to the voltage level at the collector of IGBT 10 and, in particular, to changes in that voltage. The collector monitor 20 includes a sensing capacitor 22 that is connected between the collector of the IGBT 10 and an input node 30. Current flows through the sensing capacitor 22, when the voltage at the IGBT collector is changing. The collector monitor 20 responds to that current flow so as to detect when the collector voltage changes, the rate of voltage change, and other parameters regarding the IGBT operation, as will be described.

The current ($I_{CAP}$) flowing through the sensing capacitor 22 is given by the expression $I_{CAP} = C\, dV/dt$, where C is the value of the capacitor and dV/dt is the rate of change of the voltage across the capacitor with time. The value of the sensing capacitor 22 is selected to provide a desirable magnitude of current (e.g. 10 milliamps (ma)) for operating the collector monitor 20. In an alternative embodiment, a second capacitor is connected between the input node 30 and the ground of the collector monitor 20 to operate as a filter to the signals captured from input node 30.

The terminal of sensing capacitor 22 connected to input node 30, therefore, provides an input signal to the input node 30. The collector monitor 20 has a processing circuit connected to the input node 30 and comprising a current rectifier 24, a voltage change detector 25, a collector voltage indicator 26, and a voltage change rate indicator 28.

The current rectifier 24 is connected to the input node 30 and responds to current flowing in either direction through that capacitor by producing output signals indicative of the current magnitude and direction as measured at input node 30. The voltage at the input node 30 is virtual, i.e., the voltage does not change as different currents are forced into and out of that node.

Figure 3:
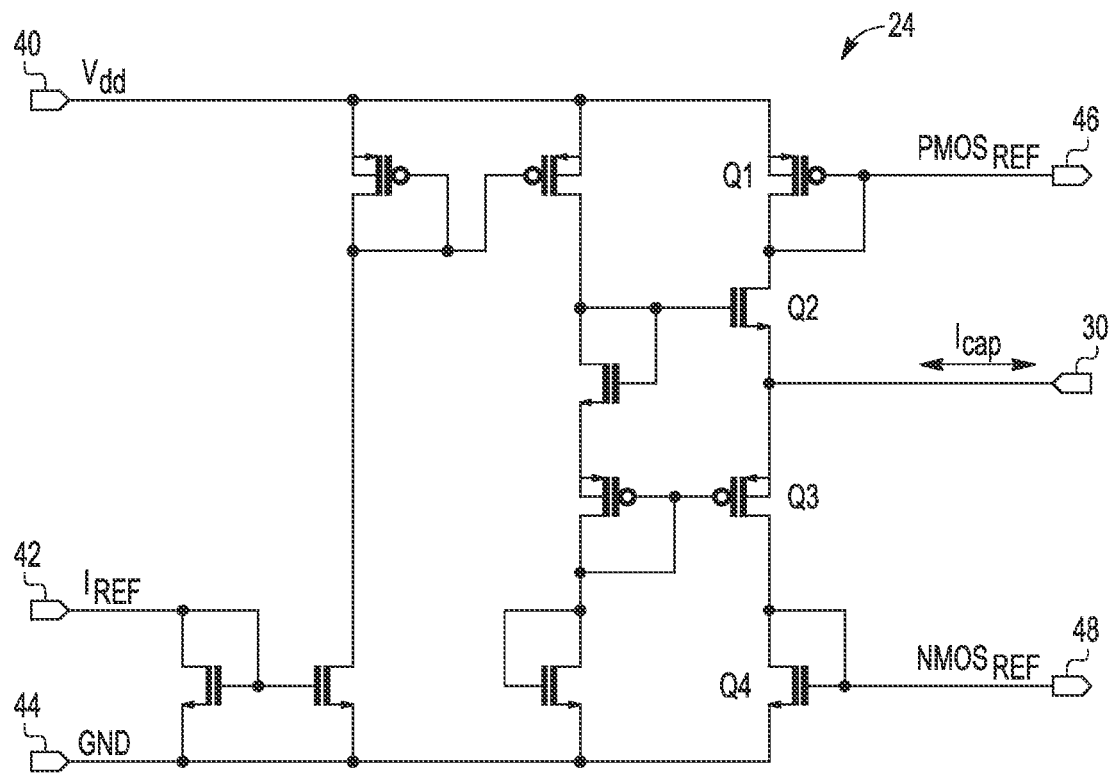
FIG. 3 is a schematic diagram of an embodiment of a circuit for a current rectifier in the collector monitor.

An example, of the internal circuitry for the current rectifier 24 is shown in FIG. 3. As shown in FIG. 3, current rectifier includes three input nodes 40, 42, and 44. Both nodes 40 and 44 are configured to receive reference voltage $V_{dd}$ and a ground voltage, respectively. Node 102 is configured to receive a reference current $I_{REF}$ that establishes a threshold level for the capacitor current in order for the collector monitor 20 to respond. Node 30 is also an input node and is coupled to the sensing capacitor 22. Node 30, therefore, generates a signal indicative of the current magnitude and direction as measured at input node 30.

When the IGBT 10 is turning on or off, the changing voltage at its collector electrode produces a current flow through the sensing capacitor 22. That current is received at input 30 of current rectifier 24. The received current is mirrored to produce one of two output signals $PMOS_{REF}$ at node 46 or $NMOS_{REF}$ at node 48. If the current at node 30 is greater than $I_{REF}$, indicating that the collector voltage of the IGBT is increasing, current rectifier 24 generates an output signal $PMOS_{REF}$ at node 46. If, however, the current at node 30 is less than $I_{REF}$, indicating that the collector voltage of the IGBT is decreasing, current rectifier 24 generates an output signal $NMOS_{REF}$ at node 48.

During time period T2 (illustrated on FIG. 2), when the IGBT 10 is turning on and the voltage level at the collector is decreasing, a significant amount of current flows from the current rectifier 24 to the sensing capacitor 22. That current flows from the Vdd voltage supply line through transistors Q1 and Q2, thereby producing a first signal, designated $PMOS_{REF}$, in the form of a current level flowing from the gate/collector connection of transistor Q1. The first signal has a level that is dependent on the current flowing through the sensing capacitor 22 and thus the rate at which the voltage level at the IGBT collector is falling. In this state, a second signal, designated $NMOS_{REF}$, produced by the current rectifier 24 is zero. Therefore, only the $PMOS_{REF}$ signal is varying when the IGBT is turning on.

In contrast, when the IGBT 10 is turning off during time period T5 (see, for example, FIG. 2) and the voltage level at the IGBT 10's collector is increasing, current flows into the current rectifier 24 from the sensing capacitor 22. The inward current flow travels through transistors Q3 and Q4 to the internal ground GND of the collector monitor 20. This produces a second signal, designated $NMOS_{REF}$, in the form of another current level flowing the gate/drain of transistor Q4. The second signal has a level that is a function of the current flowing through the sensing capacitor 22 and thus the rate at which the voltage level at the IGBT collector is rising. In this state, the first signal $PMOS_{REF}$ is zero. Therefore, the $NMOS_{REF}$ signal is varying when the IGBT is turning off. The rectifier output signal $PMOS_{REF}$ being at the supply line voltage Vdd and the output signal $NMOS_{REF}$ being at ground potential indicates that the IGBT 10 is in a steady state.

Referring to FIG. 1, the two signals $PMOS_{REF}$ and $NMOS_{REF}$ produced by the current rectifier 24 are used by the additional modules of the processing circuit 21 (e.g., modules 25, 26, and 28) to produce the output signals from the collector monitor 20.

One of those modules is the voltage change detector 25 that produces an output signal (X) in the form of a first indication whether the collector voltage level is changing. FIG. 4 is a schematic component diagram of an embodiment of voltage change detector 25 that may be incorporated in the collector monitor. Referring to FIGS. 1 and 4, the $PMOS_{REF}$ current signal (received at node 50) produces an output voltage at node 32 that indicates the rate of change of the collector voltage (dV/dt), during turn-on of the IGBT 10. The $NMOS_{REF}$ current signal is mirrored to obtain a positive output voltage at node 32, which indicates the absolute value of the collector voltage rate of change (dV/dt) during turn off of the IGBT 10. The node 32 is coupled by an inverter 33 to the output of the voltage change detector 25 to produce a binary signal having a low logic level when the collector voltage is changing and a high logic level when no change is occurring. Therefore, this first output of the collector monitor 20 provides a binary signal that indicates whether or not the IGBT collector voltage is changing.

With reference to FIGS. 1 and 5, the two signals $PMOS_{REF}$ and $NMOS_{REF}$ from the current rectifier 24 also are applied to a collector voltage indicator 26. FIG. 5 is a schematic component diagram of collector voltage indicator 26 that can be incorporated in the collector monitor. In FIG. 5, the two signals $PMOS_{REF}$ and $NMOS_{REF}$ are received at nodes 54 and 56, respectively. Input nodes 60 and 62 of collector voltage indicator 26 are connected to $V_{dd}$ and a ground voltage, respectively. Collector voltage indicator 26 is configured to produce an output signal (Y) at node 58 having a voltage that is scaled to be proportional to the voltage at the collector of the IGBT 10. Thus output signal (Y) provides a second indication denoting the IGBT collector voltage. In the exemplary implementation illustrated, the output of the collector voltage indicator 26 is reset to zero volts prior to the IGBT 10 changing conductive state, i.e., turning on or turning off. Thus even though during turn on, the IGBT collector voltage begins at a high level and then decreases, the output signal (Y) of the collector voltage indicator 26 starts at the ground voltage and increases by an amount proportional to the amount that the collector voltage is decreasing. Alternatively, during turn-on of the IGBT 10 the output signal (Y) could start at a high voltage level (e.g., Vdd) and decrease as the IGBT collector voltage decreases.

The collector voltage indicator 26 receives an input signal, designated GATE, received at node 64, from the IGBT control circuit 14 for example, which indicates whether the IGBT 10 is being turned on or turned off. The GATE signal selectively activates different sections of the collector voltage indicator 26 to respond to either the $PMOS_{REF}$ or $NMOS_{REF}$ signal. In addition, a reset circuit 38 has an RC timer that begins whenever the GATE signal changes states and that expires after predefined time interval, which is substantially longer than the turn on and turn off periods of the IGBT 10. While the timer is active, the voltage across an output capacitor 34 denotes the IGBT collector voltage. Expiration of the timer turns on a transistor switch Q5 that discharges the output capacitor 34, thereby preparing the output capacitor for the next state transition of the IGBT. Therefore, the output capacitor 34 is at ground potential when the IGBT is commanded to turn on at time period T1 in FIG. 2 and again when the IGBT is commanded to turn off at time period T4.

When the $PMOS_{REF}$ signal goes active upon the IGBT 10 starting to turn on, a proportional current flows from node 36 through the output capacitor 34 producing the output signal (Y) having a lower voltage that designates the higher voltage level at the IGBT collector. Thereafter, as the IGBT collector voltage decreases during turn on, the voltage across output capacitor 34 increases proportionally to denote that collector voltage. In a similar manner, when the $NMOS_{REF}$ signal becomes active upon the IGBT 10 turning off, the output signal (Y) begins at ground potential. Thereafter, as the level of the NMOS$_{REF}$ signal increases as the IGBT collector voltage increases, the voltage across output capacitor 34 increases proportionally to indicate the collector voltage. The maximum voltage across the output capacitor 34 is compatible with the IGBT control circuit 14 and other processing circuits that may use that output signal, and typically is about two orders of magnitude less than the maximum voltages may occur at the IGBT collector, for example.

Referring to FIGS. 1 and 6, the current rectifier signals PMOS$_{REF}$ and NMOS$_{REF}$ also are applied to a voltage change rate indicator 28. This module of the collector monitor 20 produces yet a third output signal (Z) having a lower current magnitude that is proportional to the PMOS$_{REF}$ and NMOS$_{REF}$ signals and the same polarity as whichever one of those rectifier signals is non-zero. Thus third output signal (Z) from the voltage change rate indicator 28 provides a third indication denoting the direction and the rate of the change of the IGBT collector voltage at the collector.

The three output signals (designated X, Y, and Z) from the collector monitor 20 are applied as inputs to the IGBT control circuit 14 for use in controlling application of a drive potential to the gate of the IGBT 10. Those output signals provide more information to the IGBT control circuit 14 about the IGBT operation than was provided previously by monitors that solely employed a sensing diode. The addition information can enable the transistor to be driven in an optimal manner. During the turn-off of the IGBT 10, the output signals from the collector monitor 20 and, particularly, the scaled collector voltage output from the collector voltage indicator 26, enable the IGBT control circuit 14 to determine if the collector voltage exceeds a desirable level, and take corrective action, such as clamping the collector or reducing the rate of change of collector current.

Although the invention is described herein with reference to specific embodiments, various modifications and changes can be made without departing from the scope of the present invention as set forth in the claims below. For example, other specific circuits can be used to the sections of the processing circuit. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

Unless stated otherwise, terms such as "first" and "second" are used to arbitrarily distinguish between the elements such terms describe. Thus, these terms are not necessarily intended to indicate temporal or other prioritization of such elements.

The invention claimed is:

1. A monitoring apparatus comprising:
a transistor that has an emitter, a collector and a gate, wherein a potential applied to the gate controls a conduction path between the emitter and the collector;
a capacitor having a first terminal connected to the collector and a second terminal connected to an input node of the apparatus;
a processing circuit, coupled to the input node, including a first current mirror with a first polarity and a second current mirror with a second polarity opposite the first polarity, the processing circuit configured to detect current flowing through the capacitor and generate a first signal indicating whether voltage level at the collector is increasing and a second signal indicating whether voltage level at the collector is decreasing.

2. The apparatus of claim 1, wherein the first and second signals are binary signals.

3. The apparatus of claim 1, wherein the processing circuit is configured to respond to current flowing through the capacitor by producing a signal indicating the voltage level at the collector.

4. The apparatus of claim 1, wherein the processing circuit is configured to respond to current flowing through the capacitor by producing a signal indicating a rate at which the voltage level at the collector is changing.

5. The apparatus of claim 1, wherein the processing circuit is configured to respond to current flowing through the capacitor by producing a signal indicating a rate at which the voltage level at the collector is changing and whether the voltage level is increasing or decreasing.

6. The apparatus of claim 1, wherein the processing circuit is configured to respond to current flowing through the capacitor by generating a signal indicating the voltage level at the collector is greater than a voltage level across the transistor in a non-conductive state.

7. The apparatus of claim 1, wherein the processing circuit generates a signal indicating a magnitude of current flowing through the capacitor.

8. The apparatus of claim 1, wherein the processing circuit produces a third signal indicating an amount of current flowing from the capacitor to the rectifier and a fourth signal indicating an amount of current flowing from the rectifier to the capacitor.

9. The apparatus of claim 8, wherein the processing circuit further comprises a voltage change detector that receives the third and fourth signals and responds thereto by producing the first indication whether a voltage level at the collector is changing.

10. The apparatus of claim 8, wherein the processing circuit further comprises a voltage indicator that receives the third and fourth signals from the rectifier and responds thereto by producing an output voltage that indicates the voltage level at the collector.

11. The apparatus of claim 10, wherein the output voltage is proportional to the voltage level at the collector.

12. The apparatus of claim 8, wherein the processing circuit further comprises a voltage change rate indicator that receives the third and fourth signals from the rectifier and responds thereto by producing an output current that indicates a rate of change of the voltage level at the collector.

13. The apparatus of claim 8, wherein the processing circuit comprises a voltage change rate indicator that receives the third and fourth signals from the rectifier and responds thereto by producing an output current that indicates a rate at which the voltage level at the collector is changing and whether the voltage level is increasing or decreasing.

14. An apparatus for monitoring operation of a transistor that has an emitter, a collector and a gate, wherein a potential applied to the gate controls a conduction path between the emitter and the collector, said apparatus comprising:
a capacitor external to the transistor and having a first terminal connected to the collector and a second terminal connected to an input node of the apparatus;
a rectifier having a first current mirror and producing a first signal indicating an amount of current flowing from the capacitor into the rectifier and a second current mirror and producing a second signal indicating an amount of current flowing from the rectifier to the capacitor; and a voltage change detector that receives the first and second signals and responds thereto by producing an output signal indicating whether a voltage level at the collector is changing.

15. The apparatus of claim 14, further comprising a collector voltage indicator that receives the first and second signals and responds thereto by producing an output voltage that indicates the voltage level at the collector.

16. The apparatus of claim 14, further comprising a voltage change rate indicator that receives the first and second signals and responds thereto by producing an output current that indicates a rate of change of the voltage level at the collector.

17. A method for monitoring operation of a transistor that has an emitter, a collector and a gate, wherein a potential applied to the gate controls a conduction path between the emitter and the collector, said apparatus comprising:
    providing a capacitor external to the transistor and having a first terminal connected to the collector and a second terminal connected to a monitor circuit having a first current mirror and a second current mirror;
    producing a first signal from the first current mirror indicating an amount of current flowing from the capacitor into the monitor circuit and producing a second signal indicating an amount of current flowing from the monitor circuit to the capacitor; and
    in response to detecting flow of current, providing a first indication whether a voltage level at the collector is changing.

18. The method of claim 17, further comprising in response to detecting flow of current, providing a second indication of the voltage level at the collector.

19. The method of claim 17, further comprising in response to detecting flow of current, providing a third indication of a rate at which the voltage level at the collector is changing.

20. The method of claim 17, further comprising applying a bias voltage to the gate of the transistor; and varying the bias voltage in response to detecting flow of current through the capacitor.

\* \* \* \* \*